United States Patent [19]

Izumikawa

[11] Patent Number: 5,970,106
[45] Date of Patent: Oct. 19, 1999

[54] PHASE LOCKED LOOP HAVING A PHASE/ FREQUENCY COMPARATOR BLOCK

[75] Inventor: Masanori Izumikawa, Tokyo, Japan

[73] Assignee: NEC Corporation, Tokyo, Japan

[21] Appl. No.: 08/806,109

[22] Filed: Feb. 25, 1997

[51] Int. Cl.$^6$ ..................................................... H03D 3/24
[52] U.S. Cl. ........................................... 375/376; 375/374
[58] Field of Search ..................................... 375/294, 327, 375/373, 375, 376, 374; 455/105, 113, 112, 139

[56] References Cited

U.S. PATENT DOCUMENTS

| | | | |
|---|---|---|---|
| 5,386,437 | 1/1995 | Yasuda | 375/119 |
| 5,563,921 | 10/1996 | Mesuda et al. | 375/376 |
| 5,610,954 | 3/1997 | Miyashita | 375/375 |
| 5,666,388 | 9/1997 | Neron | 375/376 |

OTHER PUBLICATIONS

Dunning et al. (1995) "An All–Digital Phase–Locked Loop with 50–Cycle Lock Time Suitable for High–Performance Microoprocesors" *EEICE Trans. Electron.* vol. E78–C: 660–670.

*Primary Examiner*—Stephen Chin
*Attorney, Agent, or Firm*—Scully,Scott, Murphy & Presser

[57] ABSTRACT

A digital phase locked loop (PLL) comprises a phase/frequency comparator block including a comparator for comparing a reference signal with an internal clock signal obtained by dividing an output clock signal of the PLL circuit. The phase/frequency comparator supplies a two-bit signal, either one of the bits having a pulse width based on the difference between the phases or frequencies of the reference signal and internal clock signal. The two-bit signal is amplified by a CMOS latch amplifier during a sense enable cycle of the amplifier to be supplied to a digital controller, which in turn controls a voltage controlled oscillator via a D/A converter. The digital PLL circuit executes frequency acquisition and phase acquisition in a single mode to simplify the circuit configuration.

8 Claims, 7 Drawing Sheets

PHASE LOCKED LOOP HAVING A PHASE/FREQUENCY COMPARATOR BLOCK

BACKGROUND OF THE INVENTION (a) Field of the Invention

The present invention relates to a phase locked loop (PLL) having a phase/frequency comparator block and, more particularly, to the structure of a phase/frequency comparator block in a PLL circuit for supplying a binary coded output for the result of the comparison. The present invention also relates to such a phase/frequency comparator block.

(b) Description of the Related Art

A PLL circuit is generally used in a microprocessor to generate a higher frequency clock signal from a lower frequency reference signal, the clock signal being in synchronism with the reference signal. A circuit configuration for a digital PLL circuit is described by Hata and Furukawa in 8th section of "DIGITAL PLL in Use of PLL-IC", (edited by Akiba Co., 1991), for example. A digital PLL circuit generally comprises a phase comparator for supplying a binary coded output for the result of the phase comparison and a voltage controlled oscillator (VCO) receiving the binary coded output through a digital filter. This type of phase comparator can be implemented by a data flip-flop circuit.

An all-digital PLL circuit comprising a phase comparator for supplying a binary coded output is described by J. Dunning et al., in "An All-Digital Phase-Locked Loop with 50-Cycle Lock Time Suitable for High-Performance Microprocessor", pp, 660–670, IEICE Transaction on Electronics, June 1995.

FIG. 1 shows a conventional digital PLL circuit 10 comprising a phase comparator 11 for supplying a binary coded output to a digital controller 13 for controlling a VCO 15. The digital PLL circuit 10 also has a frequency comparator 12 for supplying a binary coded output to the digital controller 13. The frequency comparator 12 is disposed to provide a pull-in function for the digital PLL circuit 10 in a frequency acquisition mode before the phase comparator 11 functions for phase comparison in a phase acquisition mode. The changeover between the frequency acquisition mode and the phase acquisition mode in the digital PLL circuit 10 is executed by a switching circuit, not shown, after the pull-in is completed.

SUMMARY OF THE INVENTION

It is an object of the present invention to provide a digital PLL circuit wherein both the frequency acquisition and phase acquisition are obtained in a common signal mode without switching, and accordingly, wherein a switching circuit is not necessary.

It is another object of the present invention to provide a phase/comparator block for use in the digital PLL circuit as described above.

In accordance with a first aspect of the present invention, there is provided a digital PLL circuit comprising: a phase/frequency comparator block including a phase/frequency comparator for comparing a reference signal and an internal signal simultaneously to output first and second signals, each having a pulse width based on the difference between phases or frequencies of the reference signal and the internal signal, a pair of first and second signal nodes for responding to the first and second signals, respectively, an amplifier for amplifying the level difference between the first node and second node effected by the first and second signals; a controller for receiving the output of the amplifier to output a control signal based on the output of the amplifier; a voltage controlled oscillator for receiving the control signal to output an output signal of the PLL circuit; and a frequency divider for dividing the output signal to provide the internal signal to the phase/frequency comparator.

In accordance with a second aspect of the present invention, there is provided a phase/frequency comparator block for use in a digital phase locked loop (PLL) circuit comprising a phase/frequency comparator for comparing a reference signal and an internal signal simultaneously to output first and second signal seconds signals, each having a pulse width based on the difference between phases or frequencies of the reference signal and the internal signal, a pair of first and second signal nodes for responding to the first and second signals, respectively, an amplifier for amplifying the level difference between the first node and the second node effected by the first and second signals to output a binary coded signal.

With the digital PLL circuit having a phase/frequency comparator block according to the present invention, the PLL circuit does not require separate frequency acquisition mode and phase/acquisition mode so that changeover switch is not necessary to simplify the circuit configuration of the PLL circuit.

The above and other objects, features and advantages of the present invention will be more apparent from the following description, referring to the accompanying drawings.

DESCRIPTION OF THE PREFERRED EMBODIMENTS

Figure 1:
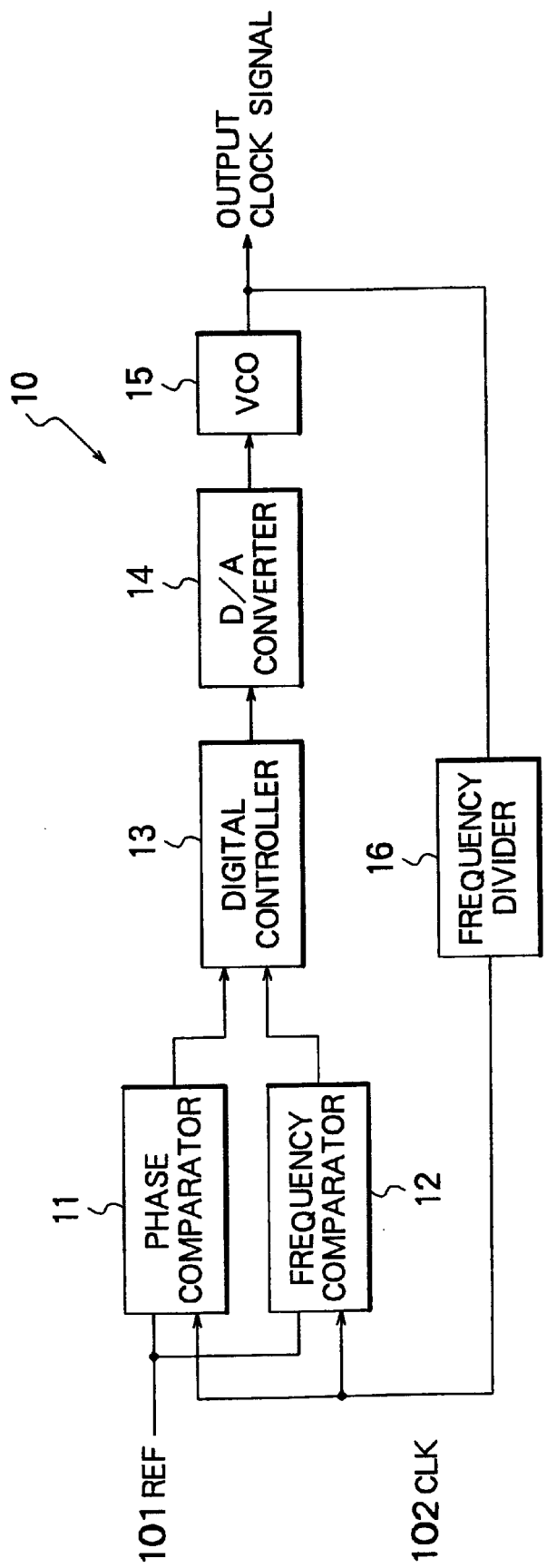
FIG. 1 is a block diagram of a conventional digital PLL circuit.

Now, the present invention will be described in more detail with reference to the accompanying drawings in which similar constituent elements are designated by related reference numerals and/or characters.

Figure 2:
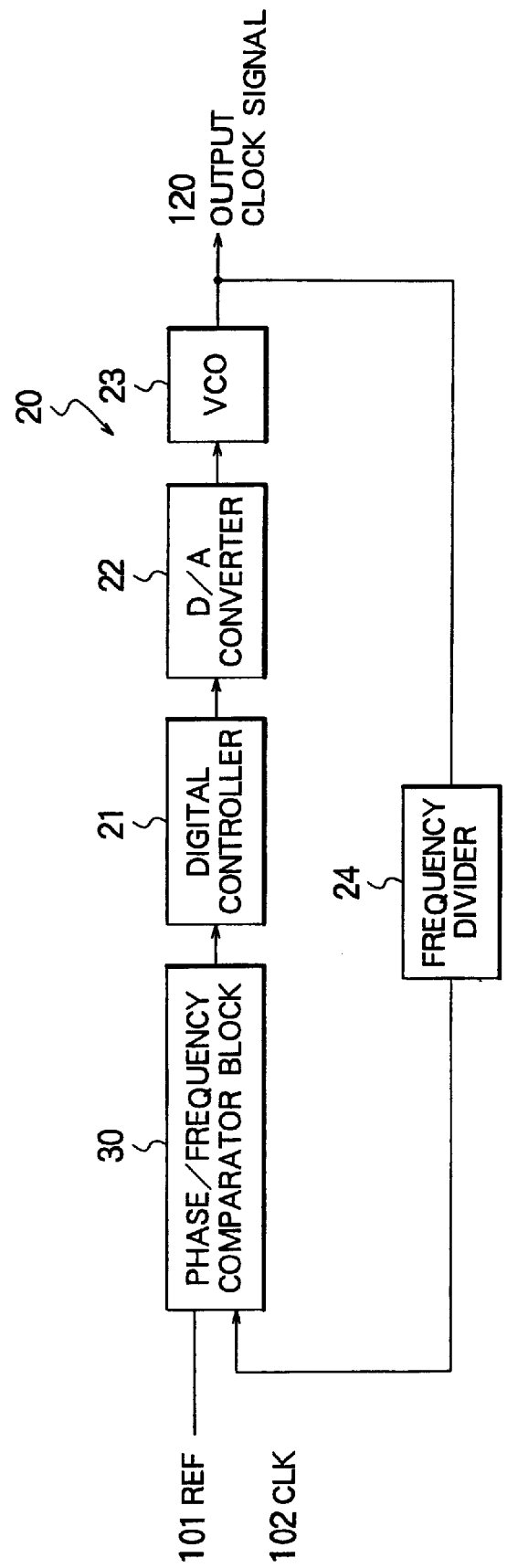
FIG. 2 is a block diagram of a digital PLL circuit according to a first embodiment of the present invention.

Referring to FIG. 2, a digital PLL circuit 20 according to a first embodiment of the present invention comprises a phase/frequency comparator block 30 for comparing a reference (REF) signal 101 received at the first input thereof with an internal clock signal (CLK) or internal signal 102 received at a second input thereof to output a binary coded signal for the result of the comparison, a digital controller 21 for receiving the binary coded signal to thereby output a digital control signal, a D/A converter 22 for converting the digital control signal into a corresponding analog control signal, a VCO 23 for receiving the analog control signal to feed an output clock signal 120 having a higher frequency than the reference signal 101, and a frequency divider 24 for dividing the output clock signal 120 to feed the internal signal 102, having a frequency corresponding to the reference signal 101, to the second input of the phase/frequency comparator block 30.

Figure 3:
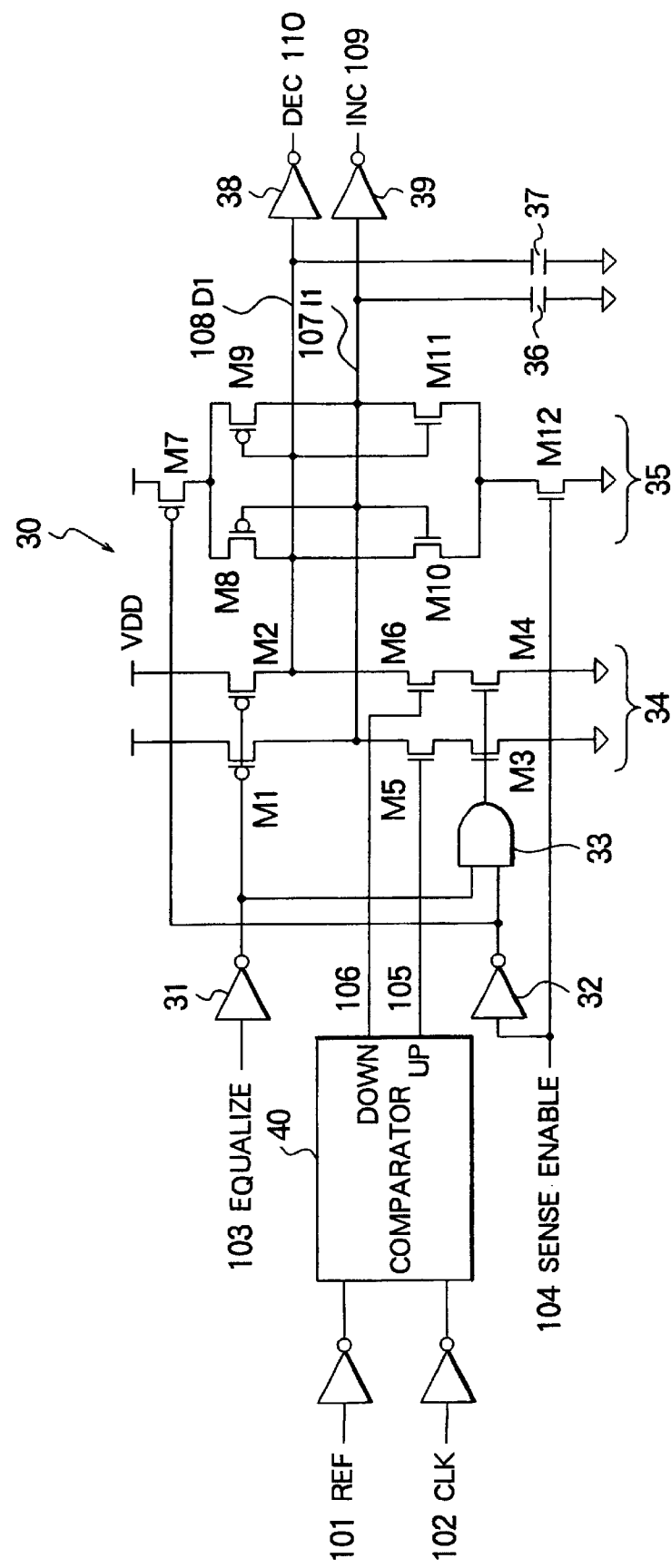
FIG. 3 is a circuit diagram of the phase/frequency comparator block shown in FIG. 2.

FIG. 3 shows an example of the circuit configuration of the phase/frequency comparator block 30 shown in FIG. 2. The phase/frequency comparator block 30 comprises a phase/frequency comparator 40 for receiving the reference signal 101 and internal (CLK) signal 102 to output a binary coded signal including an UP signal 105 and a DOWN signal 106, an inverter 31 for receiving equalizing (Equalize) signal 103, an inverter 32 for receiving a sense enable signal 104, an AND gate 33 for receiving the outputs of inverters 31 and 32, a comparator output receiving section 34 having a first MOSFET group for receiving UP signal 105 and including a pMOSFET M1 and nMOSFETs M5 and M3 and a second MOSFET group for receiving DOWN signal 106 and including a pMOSFET M2 and nMOSFETs M6 and M4, a CMOS latch amplifier 35 for amplifying the signals on node D1 and I1 output from the comparator output receiving section 34, a pair of capacitors 36 and 37 for storing charges on I1 node 107 and D1 node 108, respectively, and output inverters 38 and 39 for outputting an increment signal INC 109 and a decrement signal DEC 110, respectively, to the digital controller 21 in FIG. 2.

Figure 4:
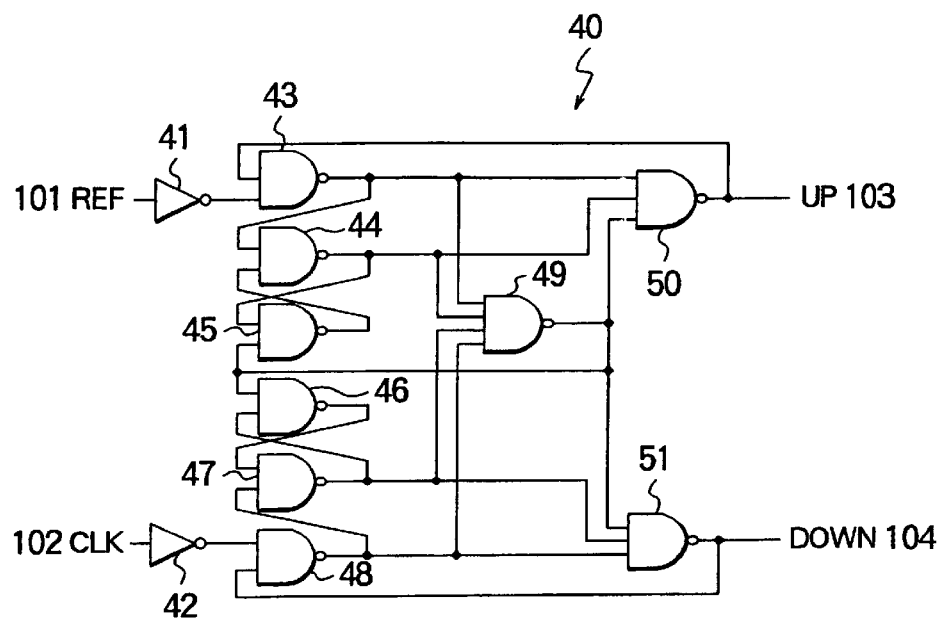
FIG. 4 is a block diagram of the phase/frequency comparator shown in FIG. 3.

FIG. 4 shows the phase/frequency comparator 40 in FIG. 3, which is similar to a phase comparator used in a conventional analog PLL circuit including a charge pump circuit receiving the output of the phase comparator. The comparator 40 comprises an inverter 41 for receiving the reference signal 101, an inverter 42 for receiving the internal signal 102, and nine NAND gates 43 through 51 for generating UP signal 103 and DOWN signal 104.

When a rise of the internal signal 102 leads a corresponding rise of the reference signal 101, i.e., when the internal signal 102 leads the reference signal 101 in phase or the internal signal has a higher frequency than the reference signal 101, DOWN signal 106 has a larger pulse width, compared to UP signal 105, depending on the phase difference between the rises, while exhibiting a relatively short pulse signal during the phase lead of the internal signal and exhibiting a relatively long pulse signal during the higher frequency of the internal signal 102.

When a rise of the internal signal 102 lags a corresponding rise of the reference signal 101, i.e., when the internal signal 102 lags the reference signal 101 in phase or the internal signal 102 has a lower frequency than the reference signal 101, UP signal 105 has a larger pulse width, compared to DOWN signal 106, depending on the difference between the phases or frequencies, while exhibiting a relatively short pulse signal during the phase lag of the internal signal 102 and exhibiting a relatively long pulse signal during the lower frequency of the internal signal 102.

Referring back to FIG. 3, the phase/frequency comparator block 30 has a first, equalizing cycle (pre-charge cycle) for initialization of the I1 node 107 and D1 node 108, wherein Sense Enable signal 104 falls and Equalize signal 103 rises to turn pMOSFETs M1 and M2 on, which pre-charge I1 node 107 and D1 node 108 at the outputs of the comparator output receiving section 34 to a high potential VDD. The phase/frequency comparator block 30 has a second, signal input cycle for receiving UP and DOWN signals 105 and 106 on I1 node 107 and D1 node 108, wherein Equalize signal 103 falls to turn MOSFETs M1 and M2 off and turn MOSFETs M3 and M4 on. The phase/frequency comparator block 30 has a third, sense enable cycle for an amplifying operation by the CMOS latch amplifier 35, wherein Equalize signal 103 remains low and Sense Enable signal 104 rises to turn nMOSFETs M3 and M4 off and turn nMOSFET M12 and pMOSFET M7 on, thereby operating the CMOS latch amplifier 35 to latch the signal received on I1 node 107 and D1 node 108. Both Equalize signal 103 and Sense Enable signal 104 are generated from the internal signal 102.

For example, if UP signal 105 has a larger pulse width than DOWN signal 106 during the signal input cycle, the potential at I1 node 107 decreases in an amount larger than the amount in which potential at D1 node 108 decreases. After Sense Enable signal 104 rises at this state to operate the comparator block 30 in the sense enable cycle, the lower potential at I1 node 107 and the higher potential at D1 node 108 are latched by CMOS latch amplifier 34 to output a high level of DEC signal 110 to the digital controller 21 in FIG. 2. On the other hand, if DOWN signal 106 has a larger pulse width than UP signal 105, a high level of DEC signal 110 is supplied to the digital controller 21. The CMOS latch amplifier 35 functions for reducing the dead zone for the signals supplied on I1 node 107 and D1 node 108.

FIGS. 5 to 8 show timing charts of the signals in the phase/frequency comparator block 30 of FIG. 3 for respective cases of the frequency and phase of the internal signal 102 with respect to those of the reference signal 101.

Figure 5:
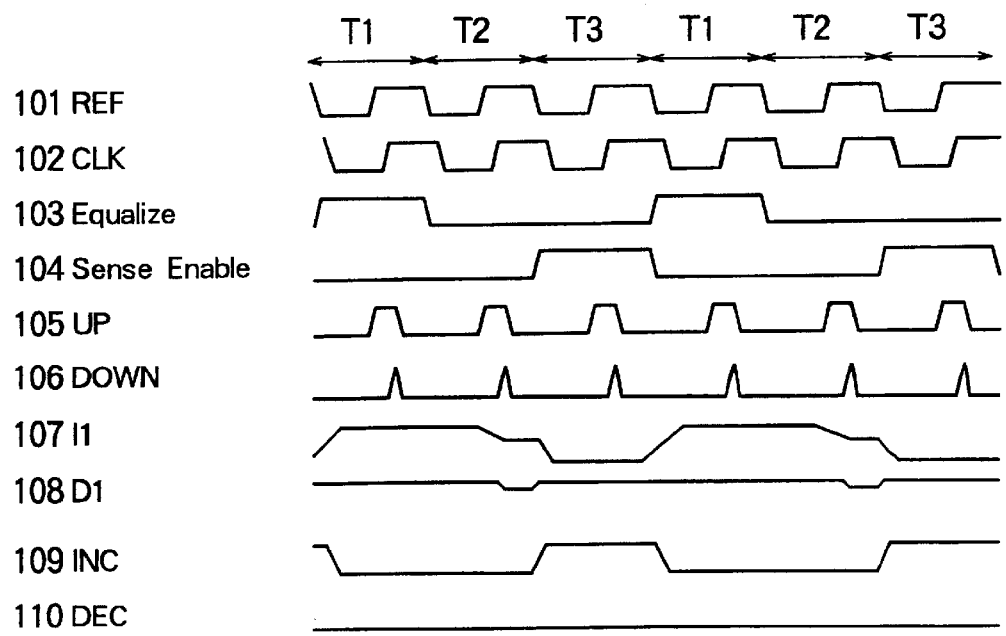
FIGS. 5 to 8 are timing charts for showing the signals in the digital PLL circuit according to the first embodiment.

FIG. 5 shows a first case in which internal signal 102 lags reference signal 101 in phase, with the frequencies of both the signals being same. In this case, UP signal 105 has a larger pulse width than DOWN signal 106 has. When Equalize signal 103 falls at the end of an equalizing cycle T1, a signal input cycle T2 begins, wherein UP signal 105 lowers the potential at I1 node 107 in an amount more than the amount in which DOWN signal 106 lowers the potential at D1 node 108. Subsequently, when Sense Enable signal 104 rises at the end of the signal input cycle T2, a sense enable cycle T3 begins, wherein the lower potential at I1 node 107 and the higher potential at D1 node are latched to a low level and a high level, respectively. As a result, the increment signal 109 and decrement signal 110 rises and remains low, respectively. The digital controller 21 in FIG. 2 responds to the high level of the increment signal and raises the output thereof to forward the rise of the internal signal 102, thereby advancing the phase of the internal signal 102.

Figure 6:
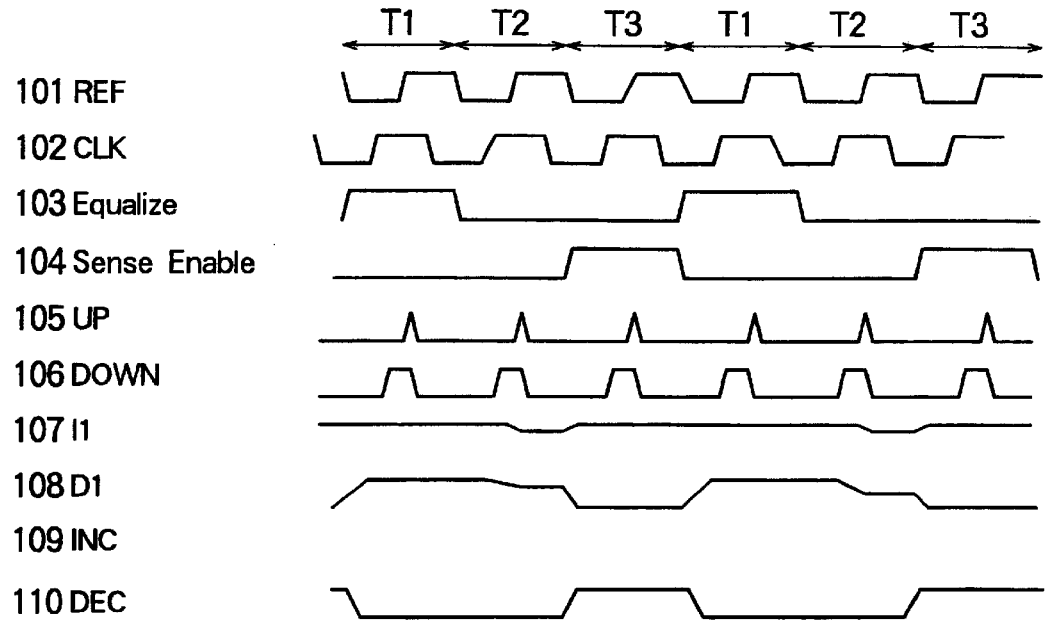

FIG. 6 shows a second case in which internal signal 102 leads the reference signal 101 in phase, with the frequencies of both the signals 101 and 102 being same. In this case, DOWN signal 106 has a larger pulse width than UP signal 105 has. During the signal input cycle T2, DOWN signal 106 lowers the potential at D1 node 108 in an amount larger than the amount in which UP signal 105 lowers I1 node 107. The potentials at I1 node 107 and D1 node 108 are latched during the following sense enable cycle T3 to raise DEC signal 110 to a high level while maintaining INC signal 109 at a low level. The digital controller 21 in FIG. 2 responds to the high level of the DEC signal 110 to lower the output thereof to retard the rise of the internal signal 102, thereby delaying the phase of the internal signal 102.

Figure 7:
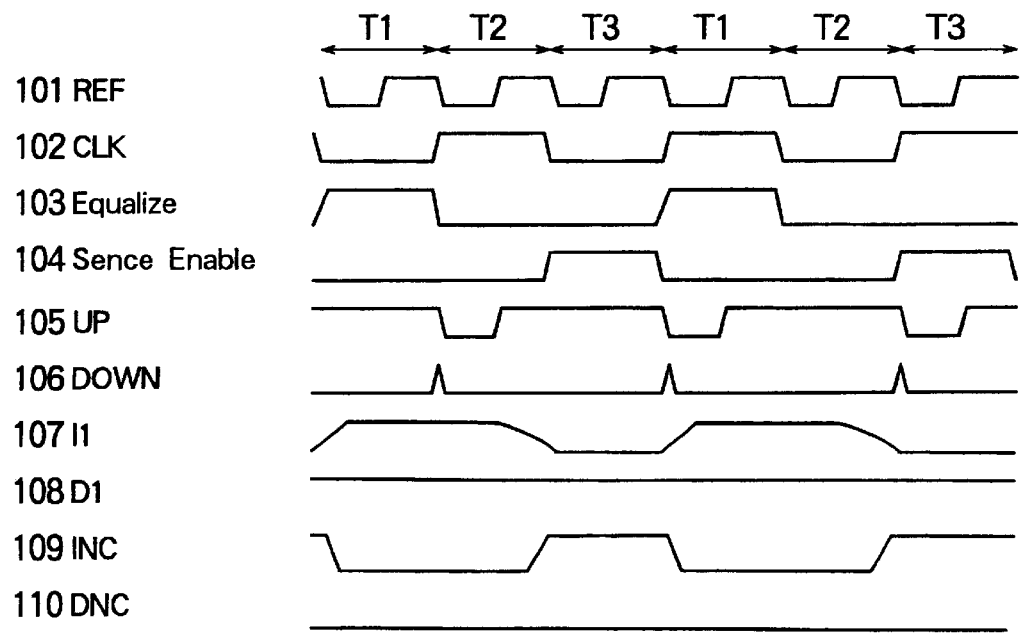

FIG. 7 shows a third case in which the internal signal 102 has a longer cycle (time), i.e. has a lower frequency than the reference signal 101. At the end of equalizing cycle T1, UP signal 105 and DOWN signal 106 fall from a high level to a low level to maintain the pre-charged I1 node 107 and D1 node 108. During the signal input cycle T2, UP signal 105 rises responsive to a rise of the reference signal 101 to lower the potential at I1 node 107. The lower potential at I1 node 107 is latched during the following sense enable cycle T3 to output a high level of INC signal 109 and a low level of DEC signal 110. UP signal 105 stays at the high level during the sense enable cycle T3. The digital controller 21 in FIG. 2 raises the output thereof to forward the rise of the internal signal 102, thereby raising the frequency of the internal signal 102.

Figure 8:
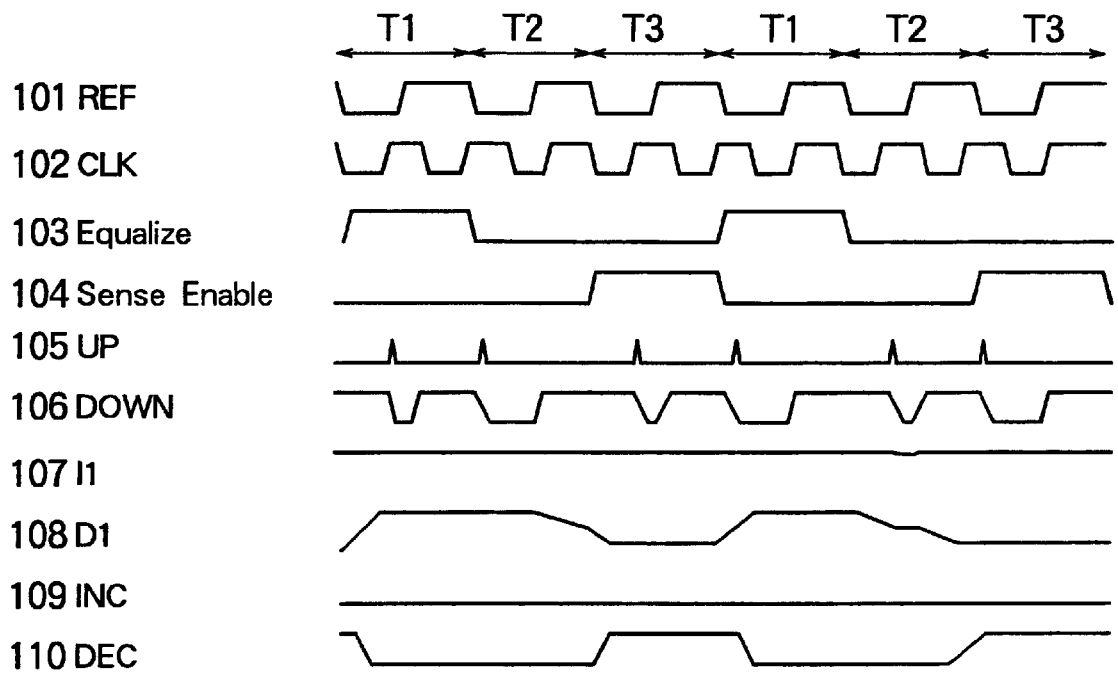

FIG. 8 shows a fourth case in which the internal signal 102 has a shorter cycle (time), i.e., a higher frequency than the reference signal 101. DOWN signal 106 rises during a signal input cycle T2 to lower the potential at D1 node 108, which is latched during the following sense enable cycle T3 to output a low level of INC signal 109 and a high level of DEC signal 110. The digital controller 21 in FIG. 2 responds to the high level of the DEC signal 110 and lowers the output thereof to retard the rise of the internal signal 102, thereby lowering the frequency of the internal signal 102.

Figure 9:
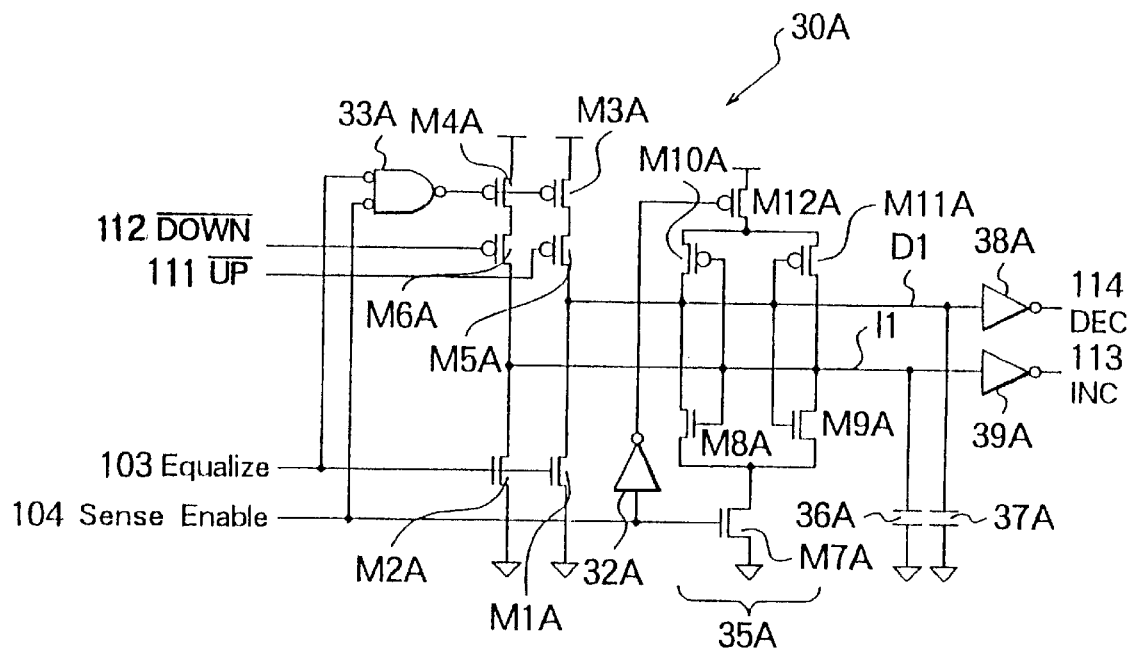
FIG. 9 is a block diagram of a phase/frequency comparator block in a PLL circuit according to a second embodiment of the present invention.

FIG. 9 shows a principal part of a phase/frequency comparator block 30A according to a second embodiment of the present invention. In this embodiment, inverted UP signal 111 and inverted DOWN signal 112 are supplied from a comparator having a modified configuration from that of FIG. 4. The principal part of the phase/frequency comparator block 30A of FIG. 9 is similar to the principal part of the phase/frequency comparator block 30 of FIG. 3 except that pMOSFETs in FIG. 3 are replaced by nMOSFETs in FIG. 9 and vice versa, and that inverter 31 in FIG. 3 is omitted and inverter 32 in FIG. 3 is replaced by inverter 32A. Corresponding elements are designated by related reference characters and detailed description thereof are omitted herein for avoiding a duplication. The phase/frequency comparator block 30A of FIG. 9 functions similarly to the first embodiment to output the INC signal 113 and DEC signal 114.

Figure 10:
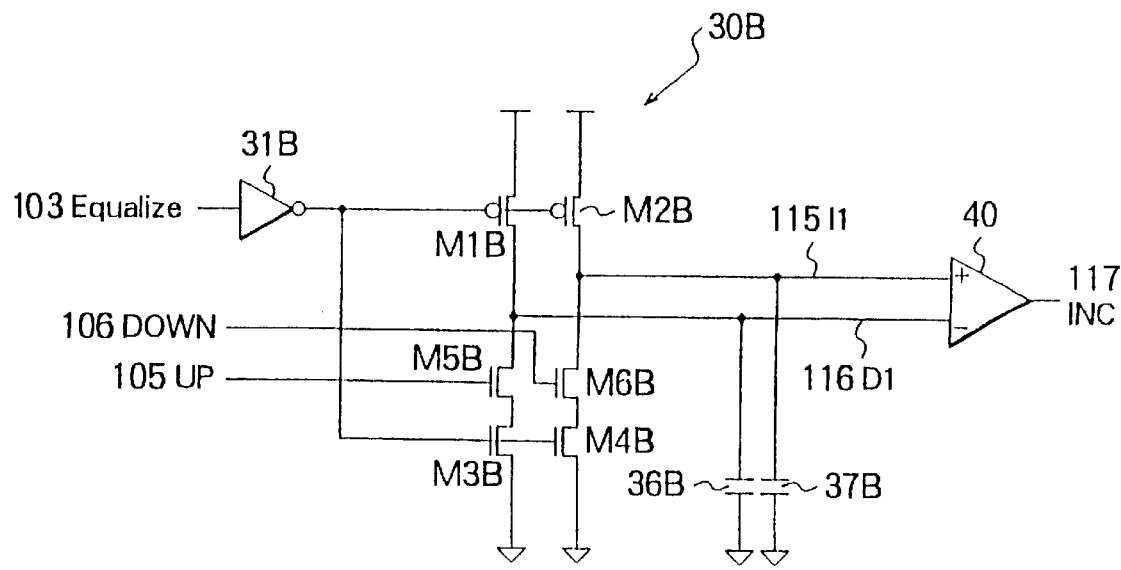
FIG. 10 is a block diagram of a phase/frequency comparator block in a PLL circuit according to a third embodiment of the present invention.

FIG. 10 shows a principal part of a phase/frequency comparator block according to a third embodiment of the present invention. In FIG. 10, the comparator 40 of FIG. 4 is provided similarly to FIG. 3, but is not specifically shown in the figure. The phase/frequency comparator block 30B according to the third embodiment is similar to the phase/frequency comparator block 30 of FIG. 3 except that a differential amplifier 40 is provided in FIG. 10 instead of the CMOS latch amplifier 35 in FIG. 3. When a digital controller receiving the output of the phase/frequency comparator 30B of FIG. 10 receives a high level or low level of the INC signal, it raises or lowers the output thereof to control the VCO.

Although the present invention is described with reference to preferred embodiments thereof, the present invention is not limited thereto and various modifications or alterations can be easily made from the embodiments by those skilled in the art without departing from the scope of the present invention as set forth in the appended claims.

What is claimed is:

1. A digital phase locked loop (PLL) circuit comprising: a phase/frequency comparator block including a phase/frequency comparator for comparing a reference signal and an internal signal and for simultaneously producing first and second output signals, wherein each of the simultaneously produced first and second output signals has a pulse width based which varies based upon the difference between phases or frequencies of the reference signal and the internal signal, a pair of first and second signal nodes for responding to the first and second signals, respectively, an amplifier for amplifying the level difference between the first node and the second node effected by the first and second signals; a controller for receiving the output of said amplifier to output a control signal based on the output of said amplifier; a voltage controlled oscillator for receiving the control signal to output an output signal of said PLL circuit; and a frequency divider for dividing the output signal to provide the internal signal to said phase/frequency comparator.

2. A digital PLL circuit as defined in claim 1, wherein the first signal has a pulse width based on the difference between the phases or differences of frequency of the reference signal and the internal signal when the internal signal lags the reference signal in phase or when the internal signal has a lower frequency compared to the reference signal, and the second signal has a pulse width based on the difference between the phases or differences of frequency of the reference signal and the internal signal when the internal signal leads the reference signal in phase or when the internal signal has a higher frequency compared to the reference signal.

3. A digital PLL circuit as defined in claim 1 wherein said phase/frequency comparator block further includes a pair of capacitors for storing charges on said first and second nodes.

4. A phase/frequency comparator block for use in a digital phase locked loop (PLL) circuit comprising a phase/frequency comparator for comparing a reference signal and an internal signal and for simultaneously producing first and second output signals, wherein each of the simultaneously produced first and second output signals has a pulse width which varies based upon the difference between phases or frequencies of the reference signal and the internal signal, a pair of first and second signal nodes for receiving the first and second signals, respectively, an amplifier for amplifying the level difference between the first node and the second node effected by the first and second signals to output a binary coded signal.

5. A phase/frequency comparator block as defined in claim 4 further comprising a pre-charge section for pre-charging said first and second signal nodes.

6. A phase/frequency comparator block as defined in claim 4 wherein said amplifier is implemented by a CMOS latch circuit.

7. A phase/frequency comparator block as defined in claim 4 wherein said amplifier is implemented by a differential amplifier.

8. A phase/frequency comparator block as defined in claim 4 further comprising a pair of capacitors for storing charge on said first and second signal nodes.

* * * * *

UNITED STATES PATENT AND TRADEMARK OFFICE
CERTIFICATE OF CORRECTION

PATENT NO. : 5,970,106 Page 1 of 1
DATED : October 19, 1999
INVENTOR(S) : Masanori Izumikawa It is certified that error appears in the above-identified patent and that said Letters Patent is hereby corrected as shown below:

Column 2,
Line 12, "signal simultaneously to" should read -- signal to simultaneously --
Line 13, after "second" and before "signals" delete "signal seconds".

Signed and Sealed this

Twentieth Day of August, 2002

Attest:

JAMES E. ROGAN
Attesting Officer  Director of the United States Patent and Trademark Office